US008761411B2

(12) United States Patent
Zickmantel

(10) Patent No.: US 8,761,411 B2
(45) Date of Patent: Jun. 24, 2014

(54) MASKING NOISE

(75) Inventor: Frank Zickmantel, Kreischa (DE)

(73) Assignee: SilenceResearch GmbH, Köln (DE)

( * ) Notice: Subject to any disclaimer, the term of this patent is extended or adjusted under 35 U.S.C. 154(b) by 781 days.

(21) Appl. No.: 12/740,453

(22) PCT Filed: Oct. 30, 2008

(86) PCT No.: PCT/EP2008/064705

§ 371 (c)(1),
(2), (4) Date: Aug. 3, 2010

(87) PCT Pub. No.: WO2009/056585

PCT Pub. Date: May 7, 2009

(65) Prior Publication Data

US 2011/0002477 A1 Jan. 6, 2011

(30) Foreign Application Priority Data

Oct. 31, 2007 (DE) ........................ 10 2007 000 608

(51) Int. Cl.
*H04R 3/02* (2006.01)
*H03G 3/20* (2006.01)

(52) U.S. Cl.
USPC ........................................... 381/73.1; 381/57

(58) Field of Classification Search
USPC ............... 381/73.1, 71.1, 71.4, 57, 94.1–94.8
See application file for complete search history.

(56) References Cited

U.S. PATENT DOCUMENTS

| | | | | |
|---|---|---|---|---|
| 3,213,199 A | | 10/1965 | Snow | |
| 4,052,564 A | * | 10/1977 | Propst et al. | 381/73.1 |
| 4,438,526 A | | 3/1984 | Thomalla | |
| 6,188,771 B1 | * | 2/2001 | Horrall | 381/73.1 |
| 7,194,094 B2 | * | 3/2007 | Horrall et al. | 381/73.1 |
| 8,107,639 B2 | * | 1/2012 | Moeller et al. | 381/73.1 |
| 2002/0150261 A1 | * | 10/2002 | Moeller et al. | 381/73.1 |
| 2003/0103632 A1 | | 6/2003 | Goubran et al. | |

FOREIGN PATENT DOCUMENTS

| | | |
|---|---|---|
| WO | 2006/076217 | 7/2006 |
| WO | 2008/074127 | 6/2008 |

* cited by examiner

*Primary Examiner* — Xu Mei
(74) *Attorney, Agent, or Firm* — Dilworth & Barrese, LLP.

(57) ABSTRACT

The invention relates to a method for masking noise as well as a control device and a masking system for carrying out said method. According to the invention, several zones in a room are independently exposed to soft sonic radiation in a basic state for masking purposes. The masking system thus comprises means for independently exposing zones in a room to sonic radiation. The masking system further comprises means which allows noise generated in a zone to be registered and preferably also be analyzed. The masking exposure to sonic radiation is reduced in the zone in which the external noise was generated and/or the masking exposure to sonic radiation is increased in the other zones in accordance with the measured or registered noise and, if applicable, the result of the analysis of the measured external noise. All in all, this allows the level of masking noise to be kept low compared with the prior art while very reliably achieving the desired masking effect.

15 Claims, 4 Drawing Sheets

MASKING NOISE

BACKGROUND OF THE INVENTION

The invention relates to a method for masking noise as well as a control device and a masking system for carrying out said method.

It is known from the reference EP 0 376 482 A2 to employ noise masking systems in open-plan offices and similar premises to ensure confidential conversations in a confined space. The need for the possibility to exchange information in a zone of a room despite the presence of other persons exists in banks, for example.

It is further known from the reference EP 0 376 482 A2, in the respective premises, to generate a permanent background noise in the entire room or confined to limited zones of the room for noise masking purposes in order to camouflage voices and prevent more remote persons from following conversations.

However, human beings try to instinctively drown out a sound source. A permanently present sound source thus results in persons speaking louder than actually necessary. In FIG. 4 this correlation becomes apparent. This is also known as "Lombard effect", such as from "H. V. Fuchs, Schallabsorber and Schalldämpfer, Springer-Verlag Berlin Heidelberg, 2007". Background noises having high sound levels may cause hearing problems which in turn cause persons to speak up. This results in a higher auditory threshold which in turn causes persons to speak up. In this cause-effect spiral the sound pressure levels are getting louder and louder until they become unbearable in the end. Typical masking systems give additional support to this effect. Such a masking sound source has thus to be adjusted at a volume higher than necessary if a human being spoke with usual sound intensity. Nevertheless, it cannot be achieved that confidentiality is observed in this way, since human beings will always speak up with increasing volume of the masking noise.

Another system for masking noise is known from the reference EP 1 291 845 A2. A loudspeaker is used to generate noise with such frequencies that are able to specifically camouflage human speech. An air diffuser which houses the loudspeaker helps to direct the sound into the room in which human voices are to be masked. Said device can be equipped with a microphone which is used to identify the appearance of external noise and only after the appearance and registration of external noise does the loudspeaker of the masking system generate sound due to masking purposes.

This noise masking system is also disadvantageous in that human beings will automatically speak up with the generation of the masking noise. A relatively loud masking noise has thus to be generated in order to achieve the desired masking effect.

It is known from the German patent application 102007000568 to absorb in rooms above all noises having a frequency within a range of about 200 and about 700 Hz in offices and the like by a respective sound absorber in order to ensure a quiet atmosphere in offices. A quiet atmosphere is supposed to guarantee good work performances. If it is very quiet in an office, however, human beings are especially sensitive to occurring noises and are easily distracted by quietly appearing noises in particular. Above all related noises occurring in a quiet atmosphere reduce the work performance. FIG. 5 illustrates this correlation by means of a study on the effect of train noises on the cognitive performance of school children in second class. The comprehensibility upon playing in two different train noises into a class room was practically not changed compared to the reference measurement without any static noises. In contrast, playing in foreign language caused a significant decrease in comprehensibility of more than 20%. Although this static noise did not contain any useful information for the second graders, as none of them was able to understand the foreign language, the work performance was reduced merely due to the related way of speaking.

If, in accordance with the theory known from the reference EP 1 291 845 A2, a relatively low masking noise was generated in such cases only upon the appearance of external noise, this would notably interfere with the ability to concentrate and thus the work performance of persons present in such a room.

SUMMARY OF THE INVENTION

Object of the present invention is to better mask noises compared with the aforementioned prior art.

In order to solve this problem several zones in a room in a basic state are independently exposed to soft sonic radiation for masking purposes, i.e. preferably with such frequencies having the ability to mask human voices particularly well. The masking system thus comprises means for independently exposing zones in a room to soft sonic radiation. In particular, there is a loudspeaker for each zone that is supposed to be independently exposed to soft sonic radiation which is designed, so that masking noise exiting the loudspeaker is directed to the zone to be masked. This noise which serves for masking purposes will be referred to as "masking noise" in the following.

The masking system further comprises means which allow noise generated in a zone to be registered and preferably to be analyzed as well. In particular, the masking system thus comprises several microphones by means of which an external sound source can be located. Depending on the sound measurement and sound registration respectively and—if applicable also depending on the result of the analysis of the measured external noise—the masking exposure to soft sonic radiation of the zone in which the external noise has been generated, is reduced and/or the masking exposure to soft sonic radiation of the other zones is intensified. The masking system thus changes from basic state to a different operating state. The volume of the masking exposure to soft sonic radiation of the zone in which external noise has been generated can be reduced to zero. The term "reduction" also comprises that the masking noise and the masking exposure to soft sonic radiation respectively is completely turned off. Reducing and amplifying the volumes of masking noise principally occur for a limited period of time. This may occur due to the fact that it is returned to the basic state in case of measured external noise after expiration of a predetermined period of time stored in the masking system, if external noise is not measured and registered respectively again. Alternatively, this can happen by the masking system detecting that external noise is no longer generated, i.e. it has in particular no longer been generated within a predetermined period of time, and thus returns to the basic state in this case.

Since in the basic state permanently masking noise is fed to the zones of interest in a room by the masking system of the invention, other temporarily occurring low noises have less disturbing impact in comparison to the masking known from EP 1 291 845 A2 according to which masking noise is generated as early as external noise appears. In contrast to the prior art it is, however, not necessary as to the invention to already adjust the masking noise in the basic state to a disproportionately loud volume. If the masking exposure to soft sonic radiation is interrupted in a zone, because external noise has been detected by the masking system, a speaking person will instinctively lower his/her voice with the reduction of the volume of the masking noise. The masking exposure to soft sonic radiation of the remaining zones can thus be relatively quiet and above all quieter compared with the prior art known from the references EP 0 376 482 A2 and EP 1 291 845 A2. If in the other zones, in which no external noise has been generated, the volume is increased upon request, i.e. in response to external noise, the permanently present masking noise can be adjusted in the basic state to an especially quiet volume. If the masking noise is already adjusted to a relatively quiet volume in the basic state, human beings do not have to speak in a loud voice right from the beginning compared with the prior art known from the references EP 0 376 482 A2 and EP 1 291 845 A2 in order to drown out the present masking noise. Thus, the volume used for exposing the remaining zones to soft sonic radiation by means of the masking system principally does not need to be adjusted to the volume level required in the prior art known from references EP 0 376 482 A2 and EP 1 291 845 A2 to achieve a desired masking effect.

Instead of interrupting the masking exposure to soft sonic radiation in the zone in which external noise is being generated, i.e. reducing the volume to zero for a limited period of time, it may be advantageous due to reasons mentioned below to only reduce the volume of the masking exposure to soft sonic radiation in order to ensure desired maskings.

It is thus possible with the masking system of the invention to expose the zones of interest in a room in the basic state comparatively quietly to soft sonic radiation for masking purposes. As soon as a noise to be masked occurs, the desired masking effect can be regularly achieved employing volumes which are below the volumes necessary as to the prior art. The masking system of the invention further masks external noise in such a way that working persons are not disturbed by permanently present, relatively loud masking noises or else by the change between relatively loud masking noise and absent masking noise. Furthermore, human beings are not forced to intend to drown out the masking noise in such a way that hereby the desired masking effects could only be achieved insufficiently.

It is particularly advantageous to interrupt the masking exposure to soft sonic radiation in the zone in which external noise has been generated and is being generated respectively or at least to lower the volume and simultaneously increase it in the other zones. All in all the necessary volumes of masking noise which are at least necessary for the desired masking can thus be minimized.

Since related noises and above all the human voice may in particular disturb other persons' ability to concentrate, occurring external noise is analyzed in one embodiment of the invention by means of a speech recognition device. Said speech recognition device is designed to determine whether external noise is being generated by human voices or by other means. Only if the masking system recognizes human voices is the basic state left in this embodiment and the masking exposure to soft sonic radiation in the affected zone in which the human voice has been generated and is being generated respectively is interrupted in the aforementioned way or at least the volume is reduced and/or increased in the other zones. Since not every external noise has to be masked in order to ensure a confidential atmosphere and many external, not related noises hardly interfere with the ability to concentrate of working persons, it is advantageous to only exit the basic state if extremely disturbing external noises, such as human voices or speech, occur. This embodiment comprising the speech recognition device is thus especially advantageous.

However, if the zones in which external noise is generally generated by human voices are spatially defined and limited with high precision, a technically simpler solution is sufficient. In this case, the masking system comprises, for example, microphones that are directed to the individual zones. Only if a predetermined volume threshold of external noise stored in the masking system is exceeded, i.e. preferably also in case of exceeding a predetermined period of time stored in the masking system, is an existing operating state of the masking system changed by reducing in this zone the volume of the masking noise and/or increasing it in other zones. In such cases only human communication in the respective zone will normally change an existing operating state of the masking system. Zones which are limited like that are present especially when there are several work stations set up in one room which are normally not left, as such as desks with associated chairs. Such zones are normally equipped with only one computer, only one telephone, only one desk and/or only one chair.

In one embodiment of the invention the volume of an external sound source is being analyzed. Depending on the detected volume, the volume of the masking noise is increased in those zones in which no external noise has been generated. As the volume of the external noise generated in one zone increases, the volume of the masking noise in the respective other zones, wherein in one embodiment, however, an upper limit for the volume of the masking exposure to soft sonic radiation is advantageously provided in order to avoid too much noise pollution, is raised. In this way it can be assured that confidentiality is guaranteed even in case of an argument which in particular involves speaking in a loud voice.

If the zone in which external noise is generated is to be determined with high reliability, a control device of the masking system comprises a comparison device used to detect at which microphone an externally measured noise is registered the loudest. The zone in which the microphone is located is then identified by the control device as the zone in which the external noise has been generated.

The masking system can be constructed in modules. Each module can be designed, so that it covers the technical requirements for one zone. In this case, the modules are preferably in communication via radio. An existing masking system can then be expanded very easily if later on another zone in a room is to be included. The individual modules can also be connected via cable on an alternative or supplementary basis.

The masking system may also be integral.

BRIEF DESCRIPTION OF THE DRAWINGS

The present invention will be described in greater detail with reference to the accompanying drawings in which FIGS. 1-3 schematically illustrate functioning of the present invention, FIG. 4 schematically illustrates a typical spatial acoustics problem.

DESCRIPTION OF THE PREFERRED EMBODIMENTS

In the following, the invention is further discussed by means of FIGS. 1 to 3.

Figure 1:
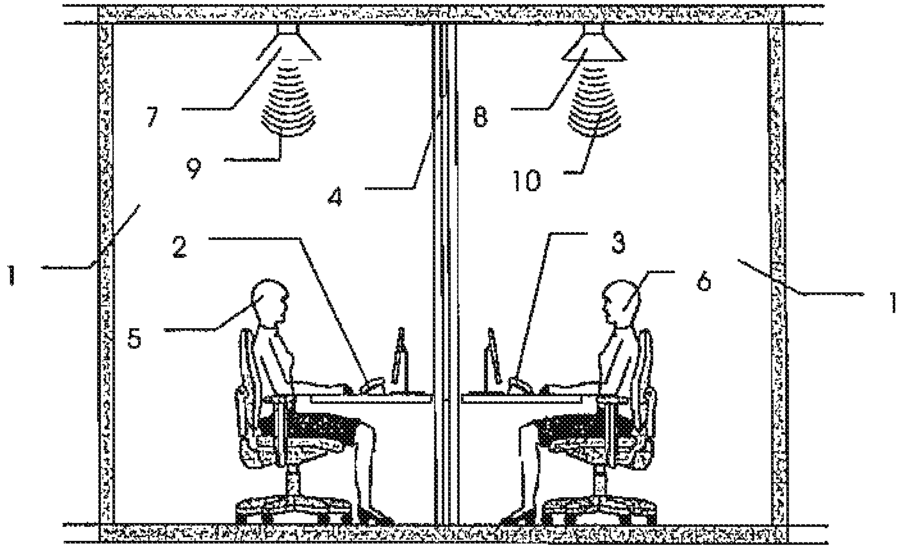

FIG. 1 shows a room 1 in which two work stations 2 and 3 are set up. Both work stations are separated by a moveable or partition wall 4. Each work station represents a very limited, predefined zone in a room in the spirit of the present invention. Such a moveable wall 4 does normally not shield noises sufficiently enough. External noise which is for example generated by the person 5 working at work station 2 is heard by person 6 working at work station 3.

Loudspeakers 7 and 8 which are part of the masking system are disposed above both work stations. Masking noise generated by the loudspeakers is released towards the work stations. In this way it is achieved that work station 2 can be exposed to soft sonic radiation independently from work station 3. FIG. 1 illustrate s the basic state. Only a very quiet masking noise 9 and 10 is played into both zones 2 and 3 respectively without attracting any attention. Both masking noises 9 and 10 may, for example, replay the sound of splashing water which human beings generally find agreeable. It is preferred to play in alternating masking noises 9 and 10, so as they have no distracting effect.

Figure 2:
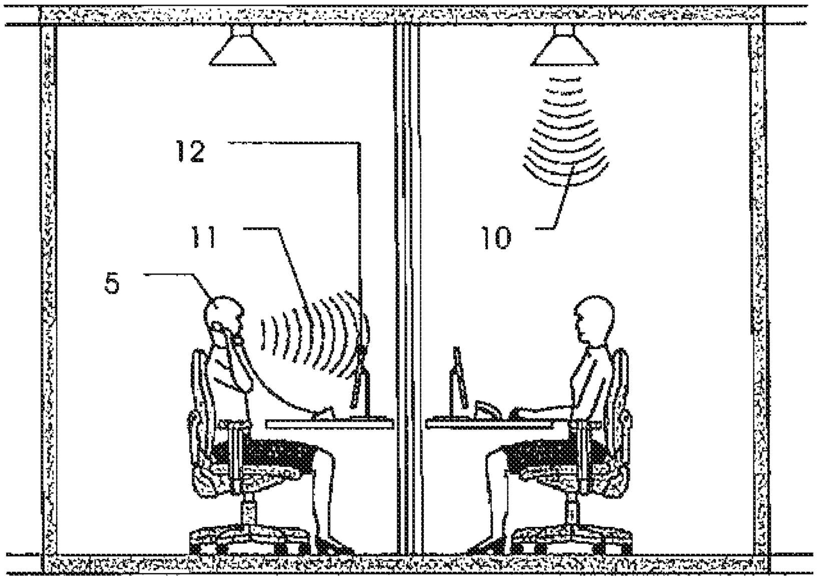

As it can be seen in FIG. 2, person 5 receives a phone call in zone 2 and begins to talk. A microphone located in the screen 12 which is directed such that it is able to register above all noise from person 5 receives the external noise thus generated in zone 2. The basic state of the masking system is left by a computer connected to the microphone of screen 12 interrupting the feeding of the masking noise 9 and simultaneously initiates an increase of the volume of the masking noise 10 exiting the loudspeaker 8. It depends on the communication volume of the person 5 in zone 2 to which extent the volume of the masking noise 10 for the adjacent zone 3 is to be increased. Since the volume of the masking noise has been reduced for zone 2, the person 5 will normally speak more quietly, so that the increase in volume of the masking noise in zone 3 will be low. This effect bases on the inversion of the Lombard effect. A quieter environment results in speaking more quietly. If the volume of the masking noise is lowered with a slight delay or if the masking noise is turned off completely, the speaking person instinctively feels observed resulting in the additional effect that the person speaks more quietly. So, a time delay does also contribute to the desired effect. The masking noise is therefore advantageously turned off completely in order to maximize this effect.

Figure 3:
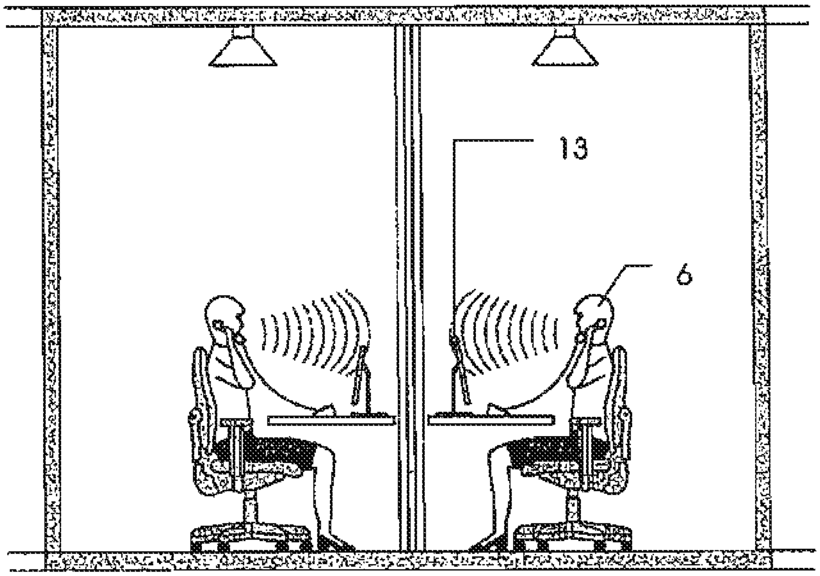

FIG. 3 illustrates another situation deviating from the basic state of the masking system. Person 6 speaks on the telephone in zone 3 in addition to person 5. A microphone integrated in the screen 13 registers the voice of person 6. In this way a computer connected to the microphone receives the information that in both zones 2 and 3 external noise is being generated and thus turns off the second masking noise 10 as well. The sound level generated by the respective communication is normally sufficient to camouflage the external noise from the adjacent zone. Furthermore, it is extremely difficult for a person to concentrate on adjacent information sources during a communication of his/her own.

If this should however not be sufficient, the masking system is preferably adjusted, so that masking noise 9 and 10 is never turned off or at least in case of the situation shown in FIG. 3 is not turned off completely, but instead the volume in the zone(s) is merely lowered compared with the basic state in which external noise is generated.

In a situation as represented in FIGS. 1 to 3, it is normally not necessary to analyze externally occurring noise by means of speech recognition. Instead it is sufficient to direct the microphones properly to the respective seat of the persons 5 and 6 which is normally the case, when the microphones are integrated in the screen on the image displaying side. An empirically determined volume level is then given, for example, which has to be exceeded to cause a change from one operating state to another. This results in the fact that not every quiet noise causes the change of an operating state. In particular, this normally ensures that human speech generated in zone 2 does not make the masking system believe that human speech is also generated in the adjacent zone 3.

In one embodiment a certain time length can be given as well during which the external noise has to occur before changing operating states. In this way it is achieved that normally only voices of persons 5 and 6 can cause a change of the state of the masking system. As discussed above, the volume of a speaking person can furthermore be advantageously reduced by that. In one embodiment the time length is at least two seconds, for example.

If one or both of the persons 5 and 6 end(s) his/her/their phone call(s), the masking system changes back into the respective prior operating state, as for example into the basic state, as soon as both persons have stopped speaking. It is hereby favorable, if only a change from one operating state back to another takes place as soon as speech pauses are long enough, so that a certain time length is exceeded. Thus, it is avoided that every small speech pause initiates an immediate change of the operating state of the masking system. This is achieved by the control device described above, i.e. for example by an externally generated noise causing to temporarily change into another respective operating state for a predetermined, fixedly adjusted period of time of for example at least 20 seconds.

Figure 4:
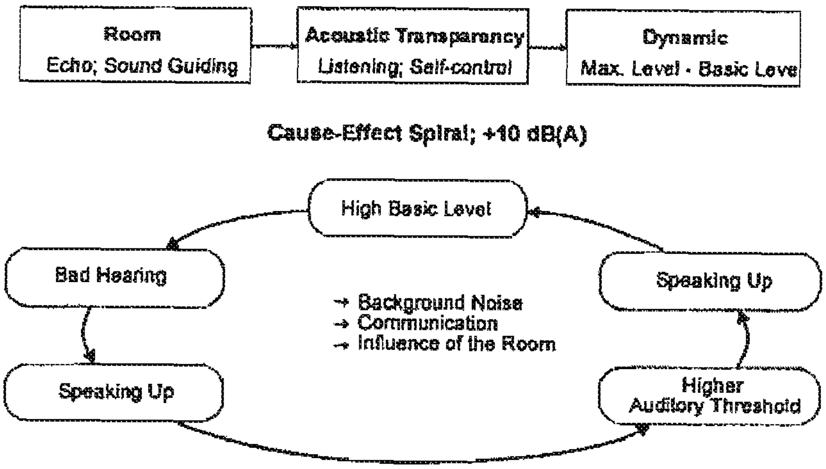

FIG. 4 illustrates a typical spatial acoustics problem, namely the Lombard effect. High basic levels cause worse linguistic and self-control. The noise levels constantly increase by continuously speaking up.

Figure 5:
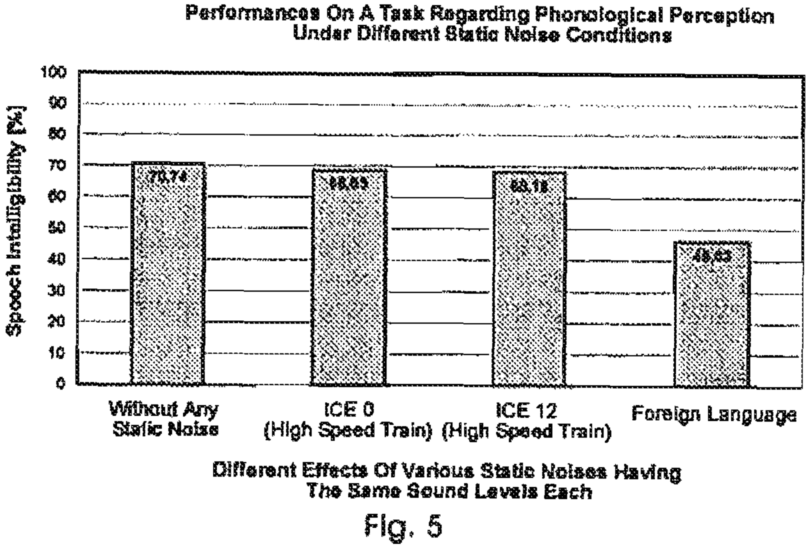
FIG. 5 is a graph illustrating comparative effect of noise.

FIG. 5 shows the result of studies on noises in a school education environment and cognitive performances of primary school children which were carried out by the University of Oldenburg and the Catholic University of Eichstätt Ingolstadt.

The invention claimed is:

1. A method for masking noise, comprising the steps of independently directing masking noise (9, 10) to a plurality of different zones (2, 3)in a room (1) not presently affected by external noise, detecting external noise (11) in one of said zones (2, 3), and upon generation of external noise (11) in one but not all of the different zones (2, 3), reducing volume of the masking noise (9, 10) which is directed to this zone, and increasing volume of the masking noise (9, 10) which is directed to the at least one other zone in which no external noise (11) is generated up to a defined upper limit.

2. The method according to claim 1, wherein in one zone (2, 3) occurring external noise (11) only causes exiting the basic state and changing the operating state respectively, when the external noise (11) is generated by human voices or speech.

3. The method according to claim 1, wherein every zone (2, 3) has a component selected from the group consisting of only one computer work station, only one telephone, only one desk, only one chair and combinations thereof.

4. The method according to claim 1, wherein a microphone is used for the detection of externally in a zone generated noise (11) in each zone (2, 3) which is directed to a chair present in the respective zone (2, 3).

5. The method according to claim 1, wherein the masking system only changes its operating state if external noise (11) generated in a zone (2, 3) exceeds a minimum volume stored in the masking system.

6. The method according to claim 1, wherein the masking system only changes its operating state if external noise (11) generated in a zone lasts longer than a period of time stored in the masking system.

7. The method according to claim 1, wherein the volume of masking noise (9, 10) is not reduced to zero, when external noise (11) is generated simultaneously in two different, adjacent zones (2, 3).

8. The method according to claim 1, wherein the volume is reduced to zero, when external noise (11) is not generated simultaneously in two different, adjacent zones (2, 3).

9. The method according to claim 2, wherein every zone (2, 3) has a component selected from the group consisting of only one computer work station, only one telephone, only one desk and only one chair and combinations thereof.

10. The method according to claim 9, wherein a microphone is used for the detection of externally in a zone generated noise (11) in each zone (2, 3) which is directed to a chair present in the respective zone (2, 3).

11. A control device with connections for at least two sound generating means (7, 8) for independently directing masking noise (9, 10) to a plurality of different zones (2, 3) in a room (1) not presently affected by external noise, and at least two means for the registration of noise, wherein the control device is designed, such that if one of the two connected means for the registration of noise registers external noise (11) in one of the zones (2, 3), (i) the connected sound generating means (7, 8) in the zone in which the external noise (11) is generated, reduces the volume of generated masking noise, and (ii) the connected sound generating means (7, 8) in the other zone(s) in which no external noise (11) is generated, increases the volume of generated masking noise up to a defined upper limit.

12. The control device according to claim 11 with means for speech recognition.

13. A masking system with at least one control device according to claim 11 to which means for the registration of noise as well as sound generating means are connected.

14. The control device according to claim 11, wherein the at least two sound generating means (7, 8) comprise at least two loudspeakers and the at least two means for registration of noise comprise at least two microphones.

15. The control device according to claim 14, additionally comprising a comparison device arranged to detect at which of the at least two microphones an externally-measured noise is registered loudest.

* * * * *